United States Patent
Kim

(10) Patent No.: US 10,511,334 B2
(45) Date of Patent: Dec. 17, 2019

(54) ERROR CORRECTION CIRCUIT, OPERATING METHOD THEREOF AND DATA STORAGE DEVICE INCLUDING THE SAME

(71) Applicant: SK hynix Inc., Gyeonggi-do (KR)

(72) Inventor: Jang Seob Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 19 days.

(21) Appl. No.: 15/909,021

(22) Filed: Mar. 1, 2018

(65) Prior Publication Data
US 2019/0056993 A1 Feb. 21, 2019

(30) Foreign Application Priority Data
Aug. 18, 2017 (KR) .................. 10-2017-0105027

(51) Int. Cl.
*H03M 13/45* (2006.01)
*H03M 13/29* (2006.01)
*G06F 11/10* (2006.01)
*G11C 29/52* (2006.01)

(52) U.S. Cl.
CPC ....... *H03M 13/451* (2013.01); *G06F 11/1012* (2013.01); *G06F 11/1068* (2013.01); *G11C 29/52* (2013.01); *H03M 13/2906* (2013.01); *H03M 13/2927* (2013.01)

(58) Field of Classification Search
CPC ............ H03M 13/451; H03M 13/2927; G06F 11/1012
See application file for complete search history.

(56) References Cited

U.S. PATENT DOCUMENTS

| 8,869,006 | B2 * | 10/2014 | Blaum | G06F 11/1076 |
| | | | | 714/6.2 |
| 10,090,865 | B2 * | 10/2018 | Bhatia | H03M 13/152 |
| 10,256,842 | B2 * | 4/2019 | Kwok | G06F 11/1076 |
| 2009/0183053 | A1 * | 7/2009 | Ito | G06F 11/106 |
| | | | | 714/764 |
| 2012/0005560 | A1 * | 1/2012 | Steiner | H03M 13/09 |
| | | | | 714/780 |
| 2017/0279467 | A1 * | 9/2017 | Bhatia | H03M 13/152 |

FOREIGN PATENT DOCUMENTS

KR 101320684 10/2013

* cited by examiner

*Primary Examiner* — Joseph D Torres
(74) *Attorney, Agent, or Firm* — IP & T Group LLP

(57) ABSTRACT

An error correction circuit includes a control unit configured to receive a data chunk including data blocks, each of the data blocks being included in corresponding codewords of first and second directions; and a decoder configured to perform a decoding operation for a codeword selected by the control unit. The control unit selects a first codeword among codewords selected in the data chunk, and provides the first codeword to the decoder by performing a flip operation in a first data block included in the first codeword. The control unit selects a second codeword among the selected codewords, and provides the second codeword to the decoder by performing a flip operation in a second data block included in the second codeword. When a decoding operation for the first codeword fails, the control unit selects the second data block to be included in different codewords from the first data block.

20 Claims, 9 Drawing Sheets

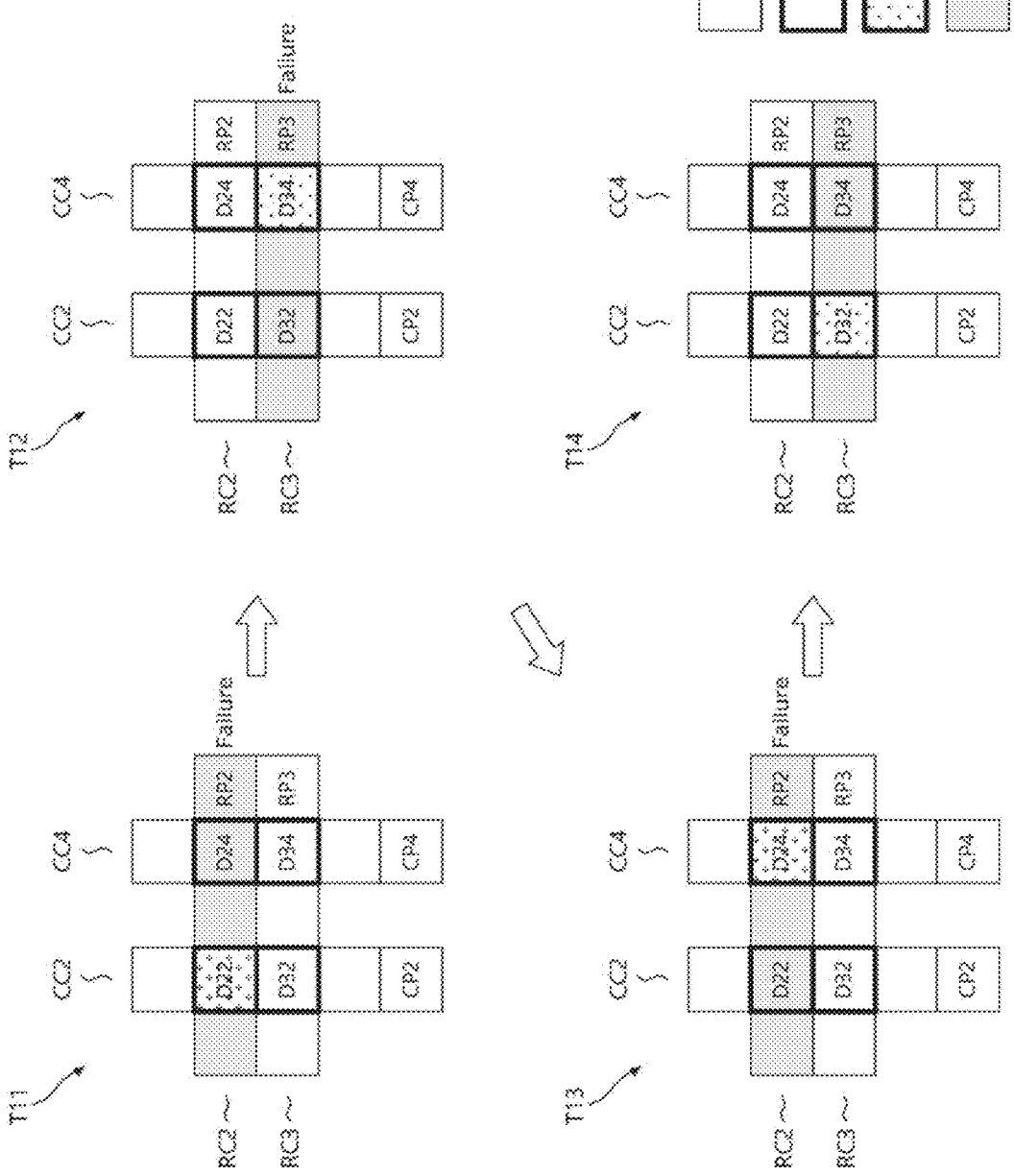

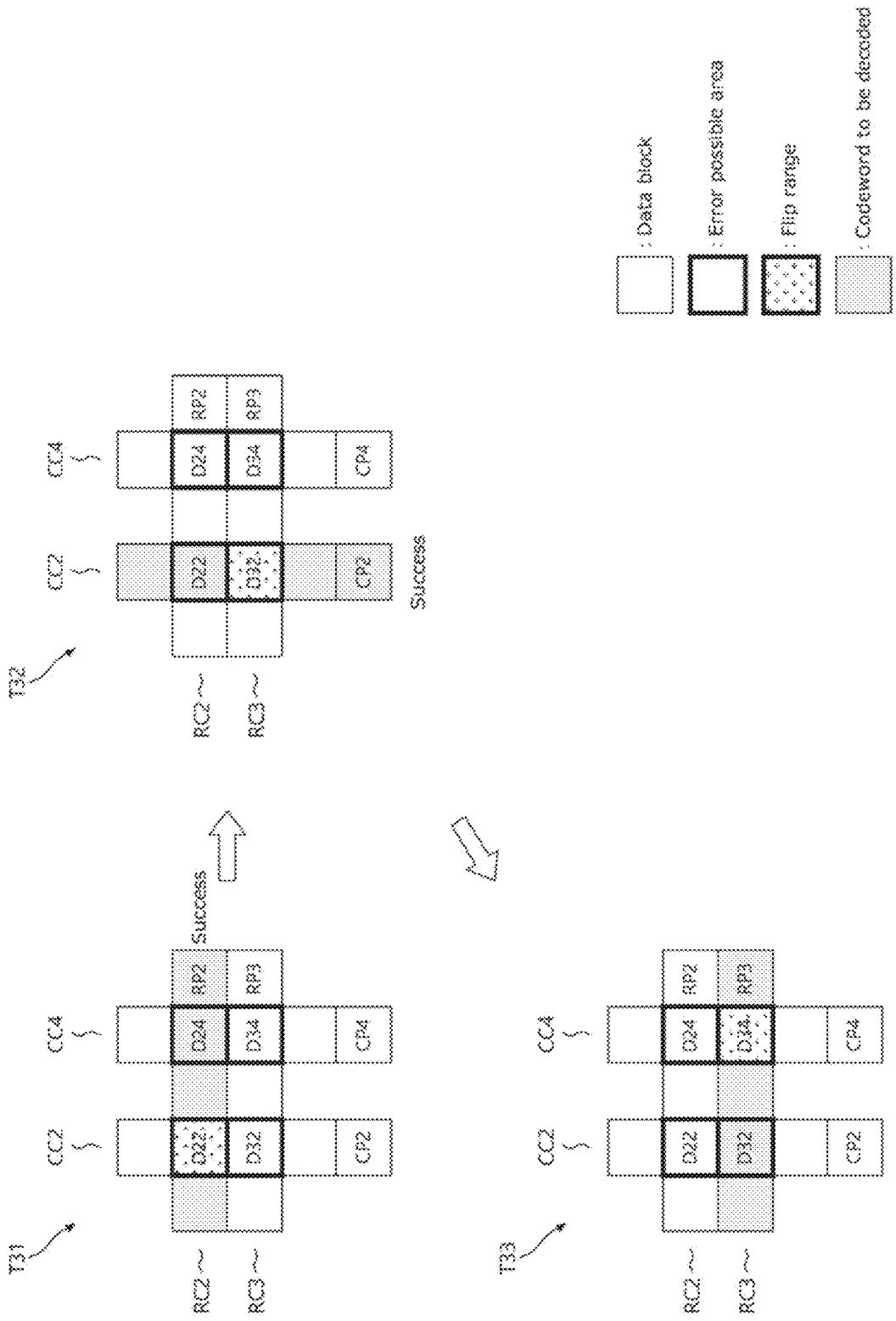

ERROR CORRECTION CIRCUIT, OPERATING METHOD THEREOF AND DATA STORAGE DEVICE INCLUDING THE SAME

CROSS-REFERENCES TO RELATED APPLICATION

The present application claims priority under 35 U.S.C. § 119(a) to Korean application number 10-2017-0105027, filed on Aug. 18, 2017, which is incorporated herein by reference in its entirety.

BACKGROUND

1. Technical Field

Various embodiments of the present disclosure generally relate to an error correction circuit. Particularly, the embodiments relate to an error correction circuit applied to a data storage device.

2. Related Art

A data storage device may be configured to store the data provided from an external device, in response to a write request from the external device. Also, the data storage device may be configured to provide stored data to the external device, in response to a read request from the external device. The external device may be an electronic device capable of processing data such as a computer, a digital camera, a mobile phone, or the like. The data storage device may operate by being in the external device, or may operate by being manufactured separately and being coupled to the external device.

A data storage device may include an error correction circuit. The error correction circuit may perform an encoding operation for the data transmitted from an external device, and the data storage device may store the data added with parity data through the encoding operation. Also, when the external device requests stored data, the error correction circuit may perform a decoding operation for stored data, and the data storage device may transmit the data error-corrected through the decoding operation to the external device.

The error correction capability/performance of the error correction circuit and quick completion of an error correction operation may be directly connected to the data reliability and operational performance of the data storage device.

SUMMARY

Various embodiments are directed to an error correction circuit, an operating method thereof and a data storage device including the same, capable of quickly performing an error correction operation.

In an embodiment, an error correction circuit may include: a control unit configured to receive a data chunk including a plurality of data blocks, each of the data blocks being included in a corresponding codeword of a first direction and a corresponding codeword of a second direction; and a decoder configured to perform a decoding operation for a codeword selected by the control unit in the data chunk, wherein the control unit selects a first codeword among codewords selected in the data chunk, and provides the first codeword to the decoder by performing a flip operation in a first data block included in the first codeword among data blocks selected in the data chunk, wherein the control unit selects a second codeword among the selected codewords, and provides the second codeword to the decoder by performing a flip operation in a second data block included in the second codeword among the selected data blocks, and wherein, when a decoding operation for the first codeword fails, the control unit selects the second data block to be included in different codewords from the first data block.

In an embodiment, a method for operating an error correction circuit may include: receiving a data chunk including a plurality of data blocks, each of the data blocks being included in a corresponding codeword of a first direction and a corresponding codeword of a second direction; selecting a first codeword among codewords selected in the data chunk; repeating a decoding operation for the first codeword by repeating a flip operation in a first data block included in the first codeword among data blocks selected in the data chunk; selecting a second codeword among the selected codewords; and repeating a decoding operation for the second codeword by repeating a flip operation in a second data block included in the second codeword among the selected data blocks, wherein, when the decoding operation for the first codeword fails, the second data block is selected to be included in different codewords from the first data block.

In an embodiment, a data storage device may include: a nonvolatile memory device configured to read and output a data chunk including a plurality of data blocks, each of the data blocks being included in a corresponding codeword of a first direction and a corresponding codeword of a second direction; and an error correction circuit including a control unit and a decoder which is configured to perform a decoding operation for a codeword selected by the control unit in the data chunk, wherein the control unit selects a first codeword among codewords selected in the data chunk, and provides the first codeword to the decoder by performing a flip operation in a first data block included in the first codeword among data blocks selected in the data chunk, wherein the control unit selects a second codeword among the selected codewords, and provides the second codeword to the decoder by performing a flip operation in a second data block included in the second codeword among the selected data blocks, and wherein, when a decoding operation for the first codeword fails, the control unit selects the second data block to be included in different codewords from the first data block.

In an embodiment, a memory system may include: a memory device configured to provide data blocks forming codewords of first and second directions and each including data bits; and a controller configured to perform a decoding operation on a selected codeword by selecting a data block in the selected codeword and flipping a predetermined number of data bits in the selected data block, wherein the controller performs the decoding operation on a second codeword of the first direction when the decoding operation for a first codeword of the first direction fails, and wherein the selected data blocks of the first and second codewords are in different codewords of the second direction.

The error correction circuit, the operating method thereof and the data storage device including the same according to the embodiments may quickly perform an error correction operation.

BRIEF DESCRIPTION OF THE DRAWINGS

FIGS. 4A and 4B are diagrams explaining how the error correction circuit of FIG. 1 performs a chase decoding process.

FIG. 5 is a diagram explaining how the error correction circuit of FIG. 1 performs a chase decoding process.

DETAILED DESCRIPTION

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, an error correction circuit, an operating method thereof and a data storage device including the same will be described below with reference to the accompanying drawings through various examples of embodiments.

Figure 1:
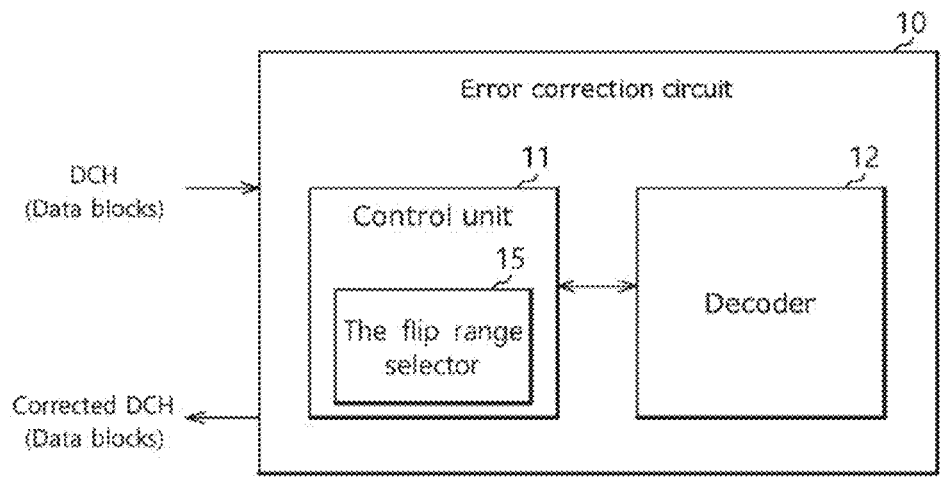
FIG. 1 is a block diagram illustrating an example of an error correction circuit in accordance with an embodiment of the present disclosure.

FIG. 1 is a block diagram illustrating an example of an error correction circuit 10 in accordance with an embodiment.

The error correction circuit 10 may receive a data chunk DCH, perform an error correction operation on the data chunk DCH, and output a corrected data chunk DCH.

The data chunk DCH may be data generated based on the turbo product code (TPC) algorithm. The data chunk DCH may include a plurality of data blocks, and each of the data blocks may be included in a corresponding codeword of a first direction and a corresponding codeword of a second direction. The first direction and the second direction may be a row direction and a column direction, respectively, or vice versa. Therefore, the data chunk DCH may include codewords of the row direction, that is, row codewords, and codewords of the column direction, that is, column codewords. The structure of the data chunk DCH will be described in more detail with reference to FIG. 2.

The error correction circuit 10 may include a control unit 11 and a decoder 12.

The control unit 11 may select a codeword, for which a decoding operation is to be performed, in the data chunk DCH, and may provide the selected codeword to the decoder 12. The control unit 11 may control the decoder 12 to perform a decoding operation on a codeword having a high possibility of succeeding in the decoding operation.

The control unit 11 may perform a pre-decoding process for the data chunk DCH. In the pre-decoding process, the decoder 12 may perform a decoding operation on each of the codewords included in the data chunk DCH according to control of the control unit 11. While the decoding operation on each of the codewords may be performed based on, for example, the Bose-Chaudhuri-Hocquenghem (BCH) algorithm, it is to be noted that the embodiment is not limited thereto. Through the pre-decoding process, the decoder 12 may successfully complete the error correction operation for the data chunk DCH or may fail in decoding operations for some codewords of the data chunk DCH.

The control unit 11 may perform a chase decoding process for the data chunk DCH. The control unit 11 may perform the chase decoding process for codewords for which decoding operations have failed in the pre-decoding process. The chase decoding process for a certain codeword may be performed by repeating a flip operation and a decoding operation until the decoding operation succeeds. The control unit 11 may perform the flip operation within a predetermined flip range selected in the codeword. The control unit 11 may perform the flip operation by flipping combinations of different bits included in the flip range each time the decoding operation is repeated. The number of bits to be flipped within the flip range may be limited to a predetermined number of flip bits, and the number of flip bits may be increased if the decoding operation using the corresponding predetermined number of flip bits continues to fail. While the decoding operation in the chase decoding process may also be performed based on, for example, the BCH algorithm, it is to be noted that the embodiment is not limited thereto.

The control unit 11 may include a flip range selector 15.

The flip range selector 15 may select a flip range in a codeword in which a chase decoding process is to be performed. The flip range may be limited to a part, for example, any one data block, among data blocks, which may include errors, of the codeword.

The decoding operation for a given codeword may fail eventually and proceed to a chase decoding process for another subsequent codeword. The subsequent codeword may be a codeword of the same direction as the direction of the previous codeword. The flip range selector 15 may select, as a flip range, a data block which is included in different codewords from a previous flip range, in the subsequent codeword. That is to say, when the decoding operation fails and proceeds to a chase decoding process for a subsequent codeword, a subsequent flip range may be selected not to be included in the same codeword as a previous flip range even in any direction.

However, when the decoding operation for a given codeword succeeds, a subsequent codeword for which a chase decoding process is to be successively performed may be a codeword of a direction different from the direction of a previous codeword and including a previous flip range. The flip range selector 15 may select, as a flip range, a data block which is not of the previous flip range, in the subsequent codeword.

Meanwhile, the flip range selector 15 may operate as described above when the intersections of codewords for which chase decoding processes are to be performed are distributed in the form of a square lattice.

A more detailed method of operating the control unit 11 including the flip range selector 15 will be described below.

The decoder 12 may perform a decoding operation on a codeword selected by the control unit 11. The decoder 12 may notify the control unit 11 of whether the decoding operation is a success or a failure. The decoder 12 may perform a decoding operation on a codeword based on, for example, the BCH algorithm.

Figure 2:
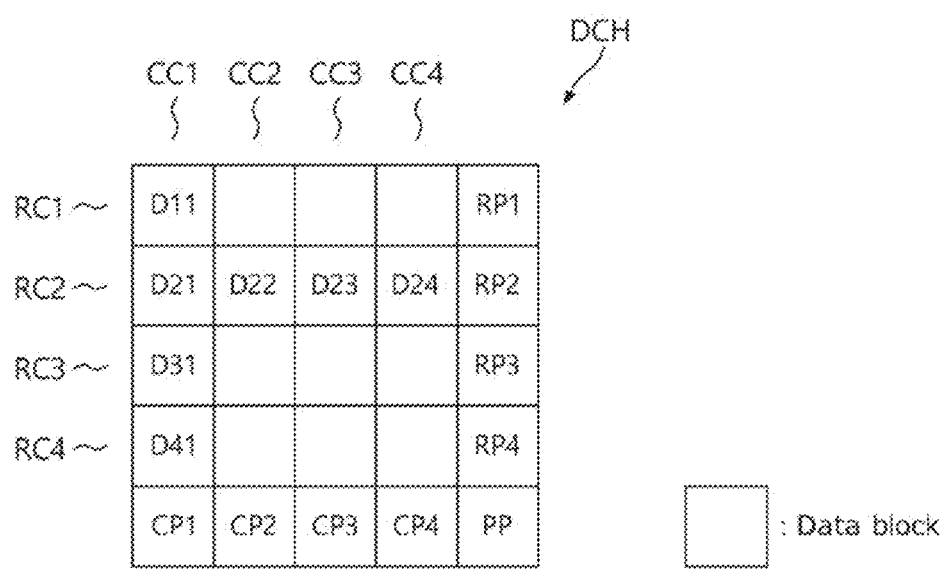
FIG. 2 is a diagram illustrating an example of a data chunk based on a TPC algorithm.

FIG. 2 is a diagram illustrating an example of a data chunk DCH based on the TPC algorithm.

Referring to FIG. 2, the data chunk DCH generated based on the TPC algorithm may include a plurality of data blocks. While not shown, each of the data blocks may include a plurality of data bits. The data blocks may be combined to configure row codewords RC1 to RC4 and column codewords CC1 to CC4. A certain one data block may be included in a certain one row codeword and at the same time may be included in a certain one column codeword. Codewords of a row direction may mean the row codewords RC1 to RC4, and codewords of a column direction may mean the column codewords CC1 to CC4. While FIG. 2 illustrates the data chunk DCH that is configured by the four row codewords RC1 to RC4 and the four column codewords CC1 to CC4, it is to be noted that the numbers of row codewords and column codewords included in the data chunk DCH are not limited thereto.

The row codewords RC1 to RC4 may include row parity data blocks RP1 to RP4 which are generated as corresponding data blocks are encoded, respectively. For example, the row codeword RC2 may include the row parity data block RP2 which is generated as data blocks D21 to D24 are encoded. While an encoding operation may be performed based on, for example, the BCH algorithm, to generate each of the row parity data blocks RP1 to RP4, it is to be noted that an encoding operation is not limited thereto in the present embodiment and may be performed based on various ECC algorithms.

The column codewords CC1 to CC4 may include column parity data blocks CP1 to CP4 which are generated as corresponding data blocks are encoded, respectively. For example, the column codeword CC1 may include the column parity data block CP1 which is generated as data blocks D11 to D41 are encoded. While an encoding operation may be performed based on, for example, the BCH algorithm, to generate each of the column parity data blocks CP1 to CP4, it is to be noted that an encoding operation is not limited thereto in the present embodiment and may be performed based on various ECC algorithms.

The data chunk DCH may further include an additional parity data block PP. The additional parity data block PP may be generated as the row parity data blocks RP1 to RP4 and the column parity data blocks CP1 to CP4 are encoded. The additional parity data block PP may be used to correct an error occurred in the row parity data blocks RP1 to RP4 and the column parity data blocks CP1 to CP4.

The decoder 12 may perform decoding operations on the row codewords RC1 to RC4, based on the row parity data blocks RP1 to RP4. In detail, a decoding operation for each of the row codewords RC1 to RC4 may be performed by correcting errors included in corresponding data blocks, based on a corresponding row parity data block. For example, a decoding operation for the row codeword RC2 may be performed by correcting errors included in the data blocks D21 to D24, based on the row parity data block RP2.

Similarly, the decoder 12 may perform decoding operations on the column codewords CC1 to CC4, based on the column parity data blocks CP1 to CP4. In detail, a decoding operation for each of the column codewords CC1 to CC4 may be performed by correcting errors included in corresponding data blocks, based on a corresponding column parity data block. For example, a decoding operation for the column codeword CC1 may be performed by correcting errors included in the data blocks D11 to D41, based on the column parity data block CP1.

In the data chunk DCH, errors included in the same data block may be corrected through a decoding operation on a corresponding row codeword or a decoding operation on a corresponding column codeword. Therefore, errors included in the same data block may be corrected through a decoding operation on a corresponding column codeword even though they are not corrected through a decoding operation for a corresponding row codeword, or vice versa.

Figure 3:
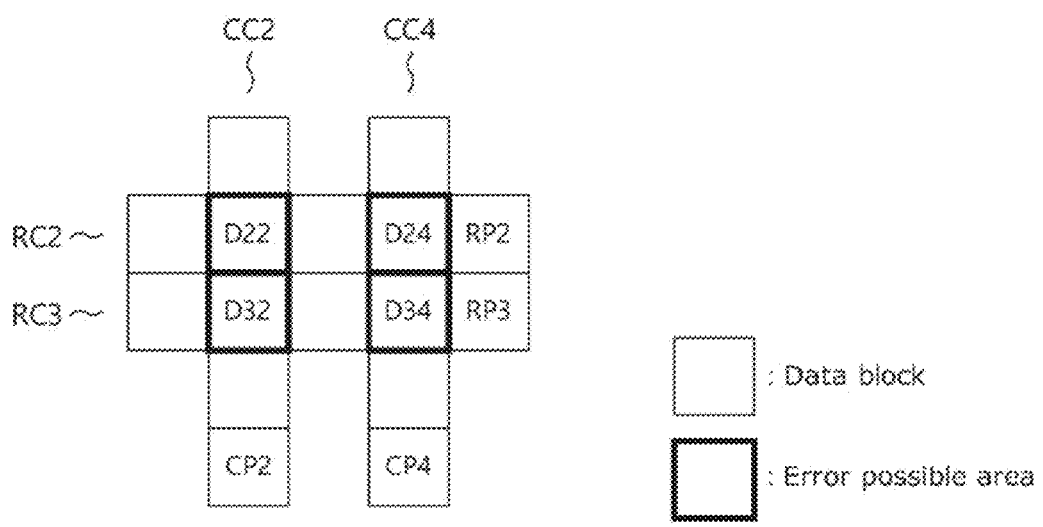
FIG. 3 is a diagram for explaining a position where errors exist in a data chunk in which the pre-decoding process is performed.

FIG. 3 is a diagram for explaining a position where errors exist in a data chunk in which the pre-decoding process is performed. FIG. 3 illustrates row codewords RC2 and RC3 and column codewords CC2 and CC4 for which decoding operations have failed in the pre-decoding process. It is assumed that decoding operations for the other codewords of the data chunk DCH have succeeded.

Referring to FIG. 3, errors may be positioned in data blocks D22, D24, D32, and D34. That is, errors may be positioned at the intersections of the row codewords RC2 and RC3 and the column codewords CC2 and CC4. Since the decoding operations on the codewords not shown in FIG. 3 have succeeded in the pre-decoding process, positions other than the intersections D22, D24, D32, and D34 do not include an error. Each of the intersections D22, D24, D32, and D34 may not necessarily include at least one error. Errors may be present in only some of the intersections D22, D24, D32, and D34.

Therefore, a chase decoding process may be performed on each of the row codewords RC2 and RC3 and the column codewords CC2 and CC4. A flip operation may be performed at the intersections D22, D24, D32, and D34 where an error may exist. According to the embodiment, when a chase decoding process is performed on a given codeword, the flip range selecting section 15 may limit a flip range to any one among the intersections included in the corresponding codeword. Further, the flip range selecting section 15 may select a flip range in a chase decoding process for a subsequent codeword, depending on a result of a decoding operation for a previous codeword.

Figure 4B:
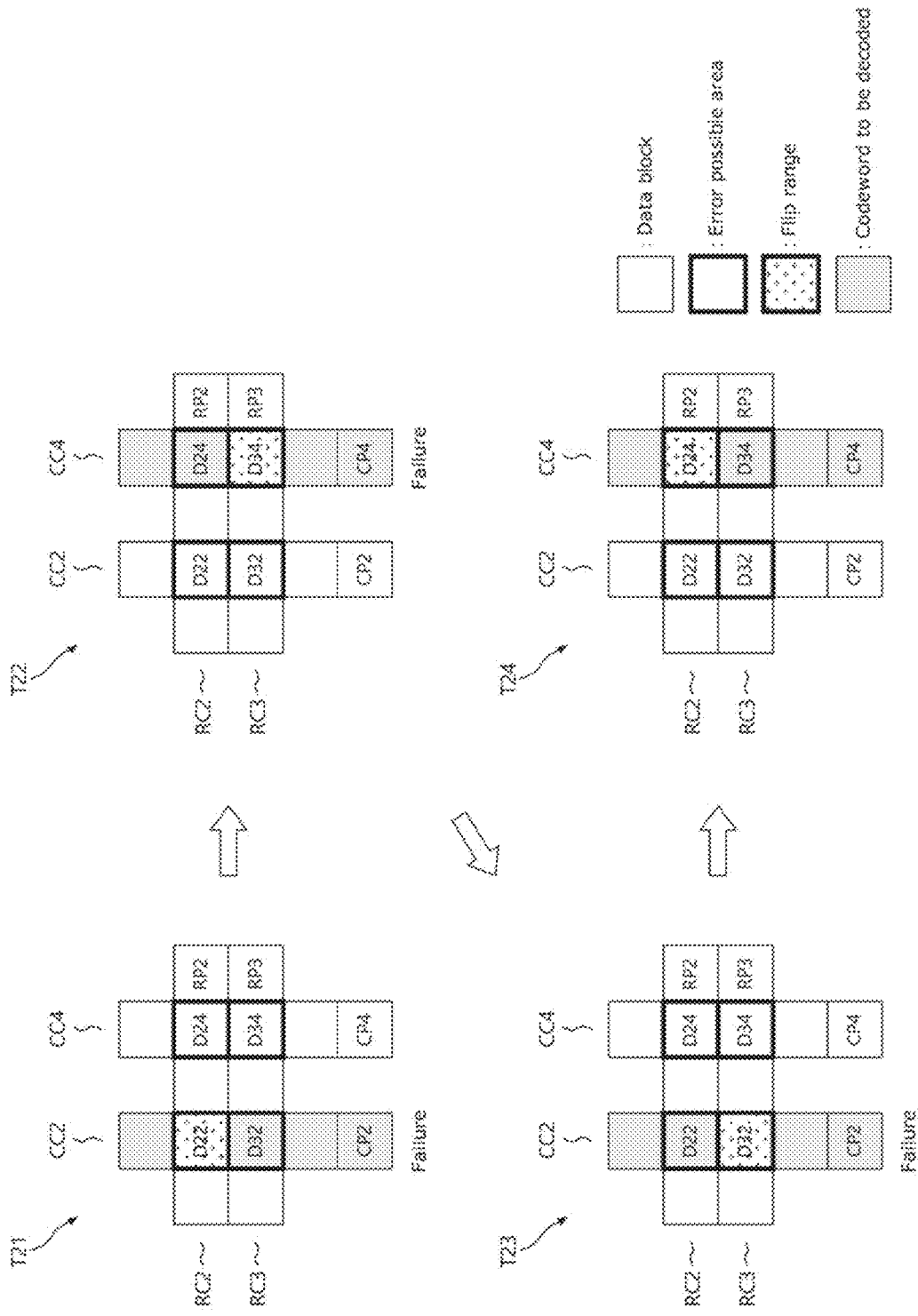

FIGS. 4A and 4B are diagrams explaining how the error correction circuit 10 of FIG. 1 performs a chase decoding process. Specifically, FIGS. 4A and 4B illustrate the row codewords RC2 and RC3 and the column codewords CC2 and CC4 for which decoding operations have failed in the pre-decoding process.

First, in the case where a chase decoding process is to be performed, the flip range selector 15 may determine whether the intersections D22, D24, D32, and D34 of the row codewords RC2 and RC3 and the column codewords CC2 and CC4 are distributed in the form of a square lattice. Since the intersections D22, D24, D32, and D34 are distributed by two in each of the row direction and the column direction, it may be determined that they are distributed in the form of a 2×2 square lattice. When the intersections D22, D24, D32, and D34 are distributed in the form of a square lattice, the flip range selector 15 may select any one of the intersections D22, D24, D32, and D34 as the flip range of a flip operation as will be described later.

First, referring to FIG. 4A, a number of flip bits may be set to "1," and chase decoding processes may be performed for the row codewords RC2 and RC3.

At a time T11, a chase decoding process may be performed on the row codeword RC2.

The flip range selector 15 may select only the data block D22 of the intersections D22 and D24 included in the row codeword RC2, as a flip range.

A decoding operation for the row codeword RC2 may be repeated as different "1" bits are flipped within the flip range D22, until the decoding operation succeeds. It is assumed that the decoding operation for the row codeword RC2 has failed when all of the bits have been flipped within the flip range D22.

At a time T12, a chase decoding process may be performed on the row codeword RC3. In other words, if the decoding operation for the previous codeword RC2 fails, another codeword RC3 of the same direction as the previous codeword RC2, that is, the row direction, is selected.

The flip range selector 15 may select only the data block D34 of the intersections D32 and D34 included in the row codeword RC3, as a flip range. The subsequent flip range D34 may be a data block which is included in codewords different from the previous flip range D22. Namely, since the subsequent flip range D34 is included in the code words RC3 and CC4 and the previous flip range D22 is included in the code words RC2 and CC2, the pair of code words RC3 and CC4 and the pair of code words RC2 and CC2 do not overlap with each other. In summary, if the chase decoding process fails for the previous flip range D22, in order to perform a decoding operation that is not influenced by the errors included in the previous flip range D22, the data block D34, which is most independent of the previous flip range D22, may be selected as a subsequent flip range.

A decoding operation for the row codeword RC3 may be repeated as different "1" bits are flipped within the flip range D34, until the decoding operation succeeds. It is assumed that the decoding operation for the row codeword RC3 has failed when all of the bits have been flipped within the flip range D34.

At a time T13, a chase decoding process may be performed again for the row codeword RC2. In other words, if the decoding operation for the previous codeword RC3 fails, another codeword RC2 of the same direction as the previous codeword RC3, that is, the row direction, is selected.

The flip range selector 15 may select only the data block D24 of the intersections D22 and D24 included in the row codeword RC2, as a flip range. That is, when a flip range cannot be selected to be included in codewords different from the previous flip range D34, the data block D24, which has not been selected as a flip range, of the intersections D22 and D24 included in the row codeword RC2 may be selected as a flip range.

A decoding operation for the row codeword RC2 may be repeated as different "1" bits are flipped within the flip range D24, until the decoding operation succeeds. It is assumed that the decoding operation for the row codeword RC2 has failed when all of the bits have been flipped within the flip range D24.

At a time T14, a chase decoding process may be performed again for the row codeword RC3. In other words, if the decoding operation for the previous codeword RC2 fails, another codeword RC3 of the same direction as the previous codeword RC2, that is, the row direction, is selected.

The flip range selecting section 15 may select only the data block D32 of the intersections D32 and D34 included in the row codeword RC3, as a flip range. Namely, the data block D32 which has not been selected as a flip range, of the intersections D32 and D34 may be selected as a flip range.

A decoding operation for the row codeword RC3 may be repeated as different "1" bits are flipped within the flip range D32, until the decoding operation succeeds.

If the decoding operation for the row codeword RC3 fails even though the decoding operation is repeated while flipping each of all bits, all possible decoding operations for the row codewords RC2 and RC3 have been attempted and thus chase decoding processes for the column codewords CC2 and CC4 may be performed as shown in FIG. 4B. Alternatively, even if the decoding operation for the row codeword RC3 succeeds at the time T14, since all possible decoding operations for the row codeword RC2 have been attempted previously, operation may proceed to the process of FIG. 4B. In FIG. 4B, it is assumed that the decoding operation for the row codeword RC3 has failed at the time T14 and thus the four intersections D22, D24, D32, and D34 are retained.

Referring to FIG. 4B, chase decoding processes may be performed on the column codewords CC2 and CC4 with the number of flip bits of "1."

At a time T21, a chase decoding process may be performed on the column codeword CC2.

The flip range selector 15 may select only the data block D22 of the intersections D22 and D32 included in the column codeword CC2, as a flip range.

A decoding operation for the column codeword CC2 may be repeated as different "1" bits are flipped within the flip range D22, until the decoding operation succeeds. It is assumed that the decoding operation for the column codeword CC2 has failed when all of the bits have been flipped within the flip range D22.

At a time T22, a chase decoding process may be performed on the column codeword CC4. In other words, if the decoding operation for the previous codeword CC2 fails, another codeword CC4 of the same direction as the previous codeword CC2, that is, the column direction, is selected.

The flip range selector 15 may select only the data block D34 of the intersections D24 and D34 included in the column codeword CC4, as a flip range. The subsequent flip range D34 may be a data block which is included in codewords different from the previous flip range D22. Namely, since the subsequent flip range D34 is included in the code words RC3 and CC4 and the previous flip range D22 is included in the code words RC2 and CC2, the pair of code words RC3 and CC4 and the pair of code words RC2 and CC2 do not overlap with each other. In summary, if the chase decoding process fails for the previous flip range D22, in order to perform a decoding operation that is not influenced by the errors included in the previous flip range D22, the data block D34, which is most independent of the previous flip range D22, may be selected as a subsequent flip range.

A decoding operation for the column codeword CC4 may be repeated as different "1" bits are flipped within the flip range D34, until the decoding operation succeeds. It is assumed that the decoding operation for the column codeword CC4 has failed when all of the bits have been flipped within the flip range D34.

At a time T23, a chase decoding process may be performed again on the column codeword CC2. In other words, if the decoding operation for the previous codeword CC4 fails, another codeword CC2 of the same direction as the previous codeword CC4, that is, the column direction, is selected.

The flip range selector 15 may select only the data block D32 of the intersections D22 and D32 included in the column codeword CC2, as a flip range. That is to say, when a flip range cannot be selected to be included in codewords different from the previous flip range D34, the data block D32 which has not been selected as a flip range, of the intersections D22 and D32 included in the column codeword CC2 may be selected as a flip range.

A decoding operation for the column codeword CC2 may be repeated as different "1" bits are flipped within the flip range D32, until the decoding operation succeeds. It is assumed that the decoding operation for the column codeword CC2 has failed when all of the bits have been flipped within the flip range D32.

At a time T24, a chase decoding process may be performed again on the column codeword CC4. In other words, if the decoding operation for the previous codeword CC2 fails, another codeword CC4 of the same direction as the previous codeword CC2, that is, the column direction, is selected.

The flip range selector 15 may select only the data block D24 of the intersections D24 and D34 included in the column codeword CC4, as a flip range. Namely, the data block D24 which has not been selected as a flip range, of the intersections D24 and D34 may be selected as a flip range.

A decoding operation for the column codeword CC4 may be repeated as different "1" bits are flipped within the flip range D24, until the decoding operation succeeds.

If the decoding operation for the column codeword CC4 fails even though the decoding operation is repeated while flipping each of all bits, all possible decoding operations for the column codewords CC2 and CC4 have been attempted. Alternatively, the decoding operation for the column codeword CC4 may succeed at the time T24.

After the chase decoding processes for all of the row codewords RC2 and RC3 and the column codewords CC2 and CC4 are performed, the error correction circuit 10 may increase a number of flip bits to "2," and the processes described above with reference to FIGS. 4A and 4B may be repeated in a similar manner.

For example, as described above at the time T11 of FIG. 4A, the flip range selector 15 may select the data block D22 as a flip range of the row codeword RC2. Then, a decoding operation for the row codeword RC2 may be repeated as different combinations of "2" bits are flipped within the flip range D22, until the decoding operation succeeds. Even though all combinations of "2" bits are attempted within the flip range D22, the decoding operation may not succeed. In this case, as described above at the time T12 of FIG. 4A, the flip range selector 15 may select the data block D34 as a flip range of the row codeword RC3. Then, a decoding operation for the row codeword RC3 may be repeated as different combination of "2" bits are flipped within the flip range D34, until the decoding operation succeeds.

FIG. 5 is a diagram explaining how the error correction circuit 10 of FIG. 1 performs a chase decoding process. Specifically, FIG. 5 illustrates a process of selecting a subsequent codeword and a subsequent flip range when a decoding operation for a given codeword succeeds.

Referring to FIG. 5, at a time T31, when a flip range is the data block D22, a decoding operation for the row codeword RC2 may succeed.

At a time T32, a chase decoding process may be performed for the column codeword CC2. Namely, a subsequent chase decoding process may be performed for the codeword CC2 of a different direction, that is, the column direction, including the previous flip range D22. That is, since the errors included in the previous flip range D22 have been corrected in a previous chase decoding process, a decoding operation may be performed preferentially for the column codeword CC2, which has an increased possibility of a decoding operation to succeed.

The flip range selector 15 may select the data block D32 as a flip range in the column codeword CC2. In other words, as a subsequent flip range, the data block D32, which has not been selected as a flip range, of the intersections D22 and D32 included in the column codeword CC2 may be selected. The decoding operation for the column codeword CC2 may succeed.

At a time T33, a chase decoding process may be performed for the row codeword RC3. Namely, a subsequent chase decoding process may be performed for the codeword RC3 of a different direction, that is, the row direction, including the previous flip range D32. That is, since the errors included in the previous flip range D32 have been corrected in the previous chase decoding process, a decoding operation may be performed preferentially for the row codeword RC3, which has an increased possibility of a decoding operation to succeed.

The flip range selector 15 may determine the data block D34 as a flip range in the row codeword RC3. Namely, as a subsequent flip range, the data block D34, which has not been selected as a flip range, of the intersections D32 and D34 included in the row codeword RC3 may be selected.

On the other hand, even if the chase decoding process for the row codeword RC3 eventually fails, a chase decoding process for the column codeword CC4 may be performed additionally since an error may exist in only the data block D34. At this time, a flip range may still be the data block D34.

While the operations shown in FIGS. 4A to 5 illustrate that a chase decoding process is performed first for a codeword of the row direction, it is to be noted that a chase decoding process may be performed first for a codeword of the column direction.

Figure 6:
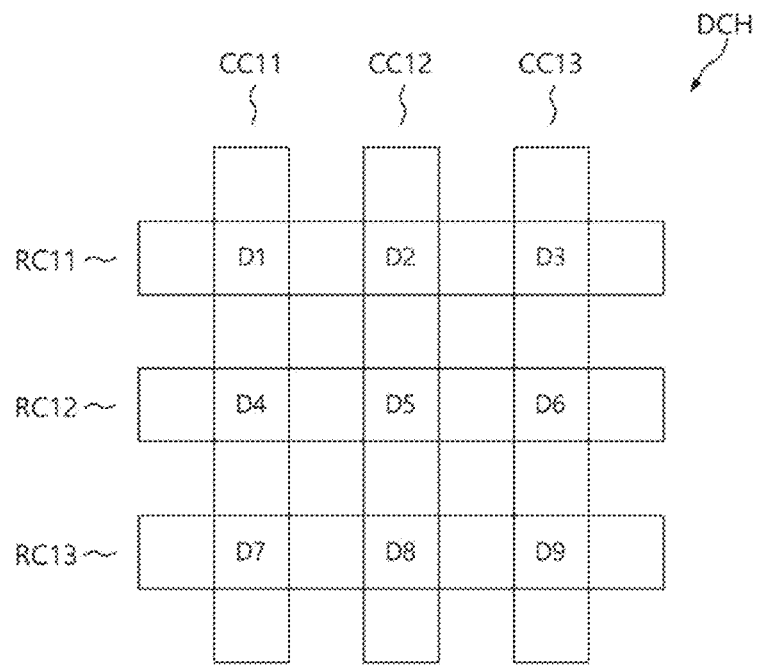
FIG. 6 is a diagram explaining how the error correction circuit of FIG. 1 performs a chase decoding process.

FIG. 6 is a diagram explaining how the error correction circuit 10 of FIG. 1 performs a chase decoding process. Specifically, FIG. 6 illustrates row codewords RC11, RC12, and RC13 and column codewords CC21, CC22, and CC23 for which decoding operations have failed in the pre-decoding process. In other words, FIG. 6 shows a case where the intersections of row codewords and column codewords are distributed in the form of a 3×3 square lattice. In FIG. 6, decoding sequence may be a sequence of codewords for which chase decoding processes are performed. The decoding sequence shown in FIG. 6 represents an example and may be changed in various ways depending on an embodiment.

Referring to FIG. 6, a chase decoding process for, for example, the row codeword RC11 may be initially performed. A flip range may be a data block D1.

If a decoding operation for the row codeword RC11 fails, a chase decoding process for the row codeword RC12 may be performed. Namely, another codeword RC12 of the same direction as the previous codeword RC11, that is, the row direction, is selected. The flip range may be a data block D5. That is, the subsequent flip range D5 may be a data block which is included in codewords different from the previous flip range D1.

If a decoding operation for the row codeword RC12 fails, a chase decoding process for the row codeword RC13 may be performed. The flip range may be a data block D9.

If a decoding operation for the row codeword RC13 fails, a chase decoding process for the row codeword RC11 may be performed. The flip range may be a data block D2.

If a decoding operation for the row codeword RC11 fails, a chase decoding process for the row codeword RC12 may be performed. The flip range may be a data block D4.

If a decoding operation for the row codeword RC12 fails, a chase decoding process for the row codeword RC11 may be performed. The flip range may be a data block D3.

If a decoding operation for the row codeword RC11 fails, a chase decoding process for the row codeword RC13 may be performed. The flip range may be a data block D7.

If a decoding operation for the row codeword RC13 fails, a chase decoding process for the row codeword RC12 may be performed. The flip range may be a data block D6.

If a decoding operation for the row codeword RC12 fails, a chase decoding process for the row codeword RC13 may be performed. The flip range may be a data block D8.

Since flip operations for all the intersections D1 to D9 have been performed, chase decoding processes may be performed by selecting codewords in the column direction, in a manner similar to the above-described method.

Figure 7:
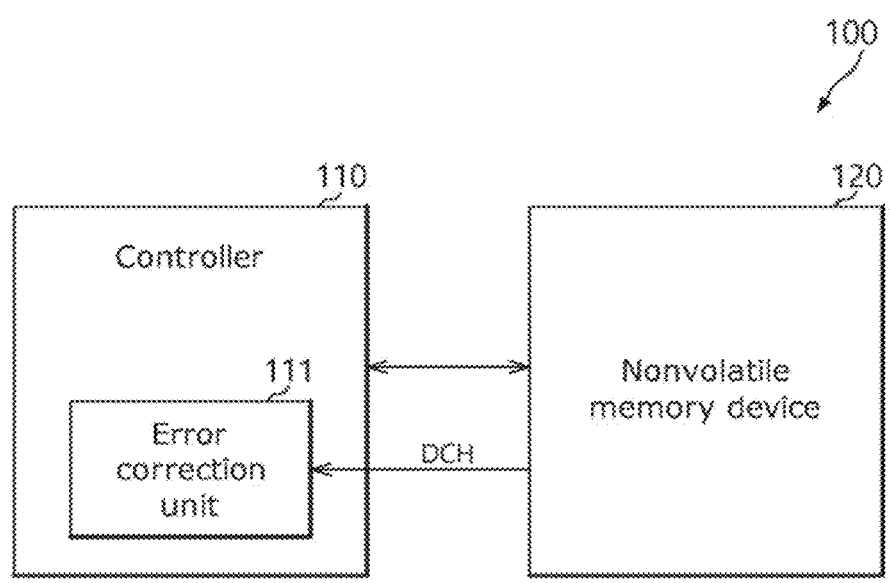
FIG. 7 is a block diagram illustrating an example of a data storage device in accordance with an embodiment.

FIG. 7 is a block diagram illustrating an example of a data storage device 100 in accordance with an embodiment of the present disclosure.

The data storage device 100 may be configured to store data provided from an external device in response to a write request from the external device. Also, the data storage device 100 may be configured to provide stored data to the external device in response to a read request from the external device.

The data storage device 100 may be configured by a Personal Computer Memory Card International Association (PCMCIA) card, a compact flash (CF) card, a smart media card, a memory stick, a multimedia card in the form of MMC, eMMC, RS-MMC and MMC-micro, a secure digital card in the form of SD, mini-SD and micro-SD, a universal flash storage (UFS), or a solid state drive (SSD).

The data storage device 100 may include a controller 110 and a nonvolatile memory device 120.

The controller 110 may control general operations of the data storage device 100. The controller 110 may store data in the nonvolatile memory device 120 in response to a write request transmitted from the external device, and may read data stored in the nonvolatile memory device 120 and output read data to the external device in response to a read request transmitted from the external device.

The controller 110 may include an error correction unit 111. The error correction unit 111 may be configured in substantially the same manner as the error correction circuit 10 of FIG. 1. The error correction unit 111 may perform an error correction operation as described above with reference to FIGS. 1 to 6, for a data chunk DCH read from the nonvolatile memory device 120.

The nonvolatile memory device 120 may store the data transmitted from the controller 110 and may read out stored data and transmit the read-out data to the controller 110, according to the control of the controller 110.

The nonvolatile memory device 120 may include a flash memory device such as a NAND flash or a NOR flash, a ferroelectric random access memory (FeRAM), a phase change random access memory (PCRAM), a magnetic random access memory (MRAM), or a resistive random access memory (ReRAM).

While it is illustrated in FIG. 7 that the data storage device 100 includes one nonvolatile memory device 120, it is to be noted that the number of nonvolatile memory devices included in the data storage device 100 is not limited thereto.

Figure 8:
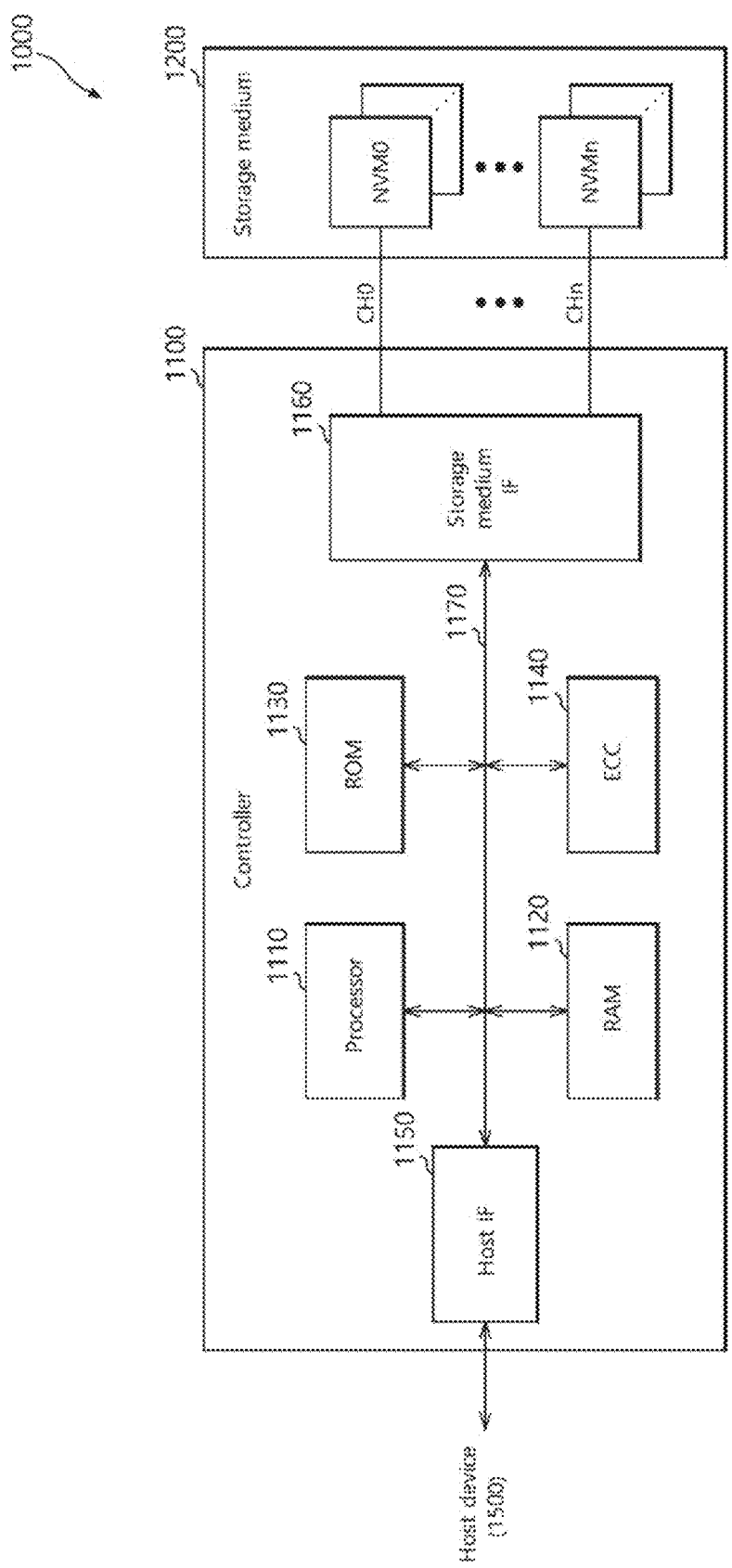
FIG. 8 is a block diagram illustrating an example of a solid state drive (SSD) in accordance with an embodiment.

FIG. 8 is a block diagram illustrating an example of a solid state drive (SSD) 1000 in accordance with an embodiment of the present disclosure.

The SSD 1000 may include a controller 1100 and a storage medium 1200.

The controller 1100 may control data exchange between a host device 1500 and the storage medium 1200. The controller 1100 may include a processor 1110, a RAM 1120, a ROM 1130, an ECC unit 1140, a host interface 1150 and a storage medium interface 1160 which are coupled through an internal bus 1170.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110, for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm. The ECC unit 1140 may be configured in substantially the same manner as the error correction circuit 10 of FIG. 1.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to control of the controller 1100.

Figure 9:
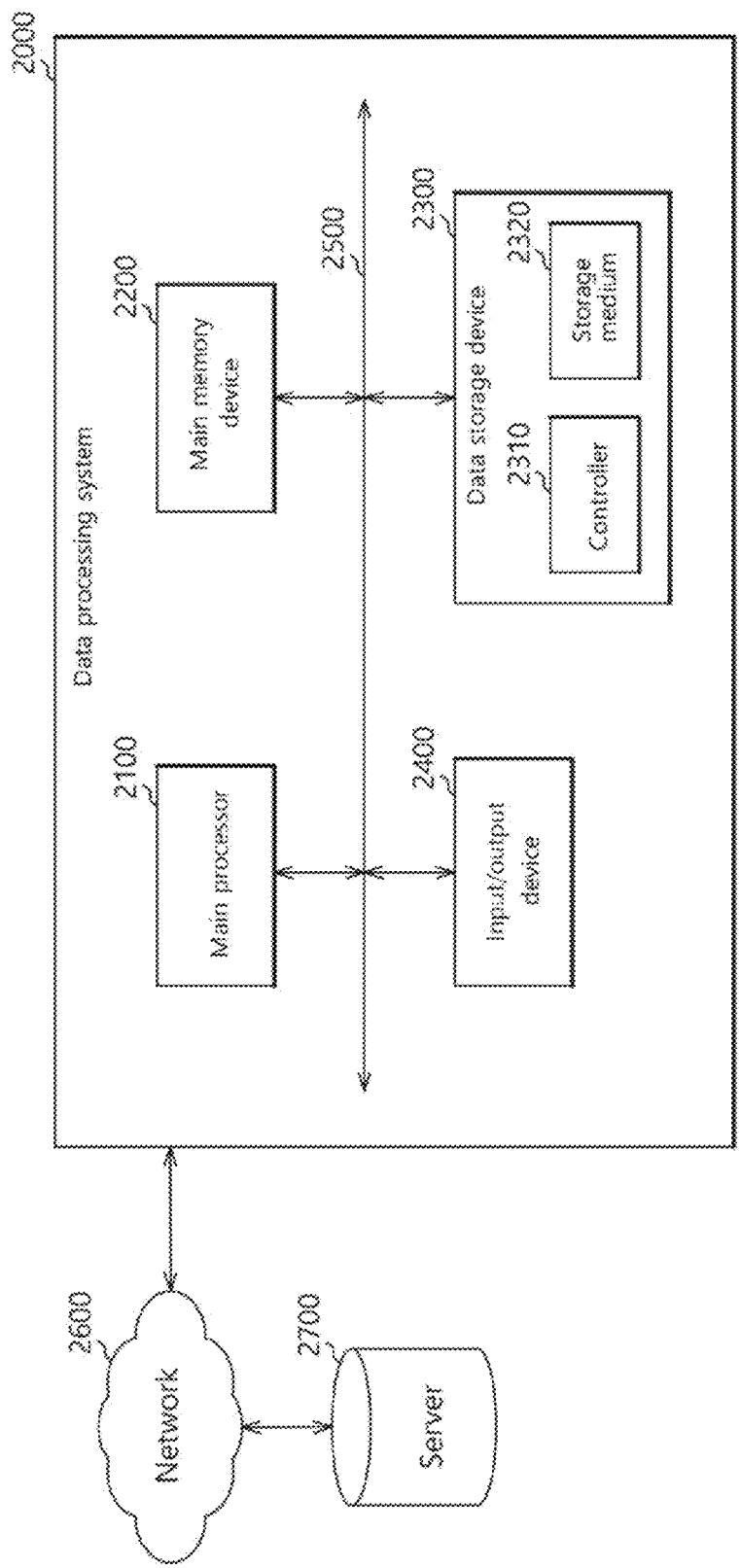
FIG. 9 is a block diagram illustrating an example of a data processing system to which the data storage device in accordance with the embodiment of the present disclosure is applied.

FIG. 9 is a block diagram illustrating an example of a data processing system 2000 in accordance with an embodiment of the present disclosure.

The data processing system 2000 may include a computer, a laptop computer, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be a central processing unit, for example, such as a microprocessor. The main processor 2100 may execute software such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate substantially similarly to the data storage device 100 of FIG. 7 or the SSD 1000 of FIG. 8.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood by those skilled in the art that the embodiments described above are mere examples. Accordingly, the error correction circuit, the operating method thereof and the data storage device including the same described herein should not be limited based on the described embodiments.

What is claimed is:

1. An error correction circuit comprising:
   a control unit configured to receive a data chunk including a plurality of data blocks, each of the data blocks being included in a corresponding codeword of a first direction and a corresponding codeword of a second direction; and
   a decoder configured to perform a decoding operation on a codeword selected by the control unit in the data chunk,
   wherein the control unit selects a first codeword among codewords selected in the data chunk, and provides the first codeword to the decoder by performing a flip operation in a first data block included in the first codeword among data blocks selected in the data chunk,
   wherein the control unit selects a second codeword among the selected codewords, and provides the second codeword to the decoder by performing a flip operation in a second data block included in the second codeword among the selected data blocks, and
   wherein, when the decoding operation for the first codeword fails, the control unit selects the second data block to be included in different codewords from the first data block.

2. The error correction circuit according to claim 1, wherein the selected data blocks are positioned at intersections of the selected codewords.

3. The error correction circuit according to claim 2, wherein the intersections are distributed in the form of a square lattice.

4. The error correction circuit according to claim 1, wherein, when the decoding operation for the first codeword fails, the control unit selects a codeword of the same direction as the first codeword, as the second codeword.

5. The error correction circuit according to claim 1, wherein, when the decoding operation for the first codeword fails, the control unit selects a codeword of a different direction from the first codeword, as the second codeword.

6. The error correction circuit according to claim 1, wherein, when the decoding operation for the first codeword succeeds, the control unit selects a codeword, which is of a different direction from the first codeword and includes the first data block, as the second codeword.

7. The error correction circuit according to claim 1, wherein, when the second data block cannot be selected to be included in different codewords from the first data block, the control unit selects, among the selected data blocks, a data block which is included in the second codeword and for which the flip operation has not been performed, as the second data block.

8. The error correction circuit according to claim 1,
   wherein the control unit performs a pre-decoding process on the data chunk, and
   wherein the selected codewords are codewords for which decoding operations have failed in the pre-decoding process.

9. The error correction circuit according to claim 1, wherein the control unit performs the flip operation by flipping each of different combinations of bits of a predetermined number of flip bits in each data block.

10. A method for operating an error correction circuit, comprising:
    receiving a data chunk including a plurality of data blocks, each of the data blocks being included in a corresponding codeword of a first direction and a corresponding codeword of a second direction;
    selecting a first codeword among codewords selected in the data chunk;
    repeating a decoding operation for the first codeword by repeating a flip operation in a first data block included in the first codeword among data blocks selected in the data chunk;
    selecting a second codeword among the selected codewords; and
    repeating a decoding operation for the second codeword by repeating a flip operation in a second data block included in the second codeword among the selected data blocks,
    wherein, when the decoding operation for the first codeword fails, the second data block is selected to be included in different codewords from the first data block.

11. The method according to claim 10, wherein the selected data blocks are positioned at intersections of the selected codewords.

12. The method according to claim 11, wherein the intersections are distributed in the form of a square lattice.

13. The method according to claim 10, wherein, when the decoding operation for the first codeword fails, the second codeword is a codeword of the same direction as the first codeword.

14. The method according to claim 10, wherein, when the decoding operation for the first codeword fails, the second codeword is a codeword of a different direction from the first codeword.

15. The method according to claim 10, wherein, when the decoding operation for the first codeword succeeds, the second codeword is a codeword of a different direction from the first codeword and includes the first data block.

16. The method according to claim 10, wherein, when the second data block cannot be selected to be included in different codewords from the first data block, the second data block is selected, among the selected data blocks, as a data block which is included in the second codeword and for which the flip operation has not been performed.

17. The method according to claim 10, further comprising:
performing a pre-decoding process for the data chunk,
wherein the selected codewords are codewords for which decoding operations have failed in the pre-decoding process.

18. The method according to claim 10, wherein the flip operation is performed by flipping each of different combinations of bits of a predetermined number of flip bits in each data block.

19. A data storage device comprising:
a nonvolatile memory device configured to read and output a data chunk including a plurality of data blocks, each of the data blocks being included in a corresponding codeword of a first direction and a corresponding codeword of a second direction; and
an error correction circuit including a control unit and a decoder which is configured to perform a decoding operation for a codeword selected by the control unit in the data chunk,
wherein the control unit selects a first codeword among codewords selected in the data chunk, and provides the first codeword to the decoder by performing a flip operation in a first data block included in the first codeword among data blocks selected in the data chunk,
wherein the control unit selects a second codeword among the selected codewords, and provides the second codeword to the decoder by performing a flip operation in a second data block included in the second codeword among the selected data blocks, and
wherein, when a decoding operation for the first codeword fails, the control unit selects the second data block to be included in different codewords from the first data block.

20. The data storage device according to claim 19, wherein the selected data blocks are positioned at intersections of the selected codewords.

* * * * *